(12) United States Patent
Clark

(10) Patent No.: US 9,899,956 B2
(45) Date of Patent: Feb. 20, 2018

(54) 3D PRINTED SOLAR ENERGY

(71) Applicant: Daniel S Clark, Orangevale, CA (US)

(72) Inventor: Daniel S Clark, Orangevale, CA (US)

( * ) Notice: Subject to any disclaimer, the term of this patent is extended or adjusted under 35 U.S.C. 154(b) by 0 days.

(21) Appl. No.: 14/835,578

(22) Filed: Aug. 25, 2015

(65) Prior Publication Data
US 2016/0056316 A1 Feb. 25, 2016

Related U.S. Application Data

(60) Provisional application No. 62/041,480, filed on Aug. 25, 2014, provisional application No. 62/130,397, filed on Mar. 9, 2015, provisional application No. 62/132,256, filed on Mar. 12, 2015.

(51) Int. Cl.
| | |
|---|---|
| *H01L 31/044* | (2014.01) |
| *H02S 30/10* | (2014.01) |
| *H02S 40/22* | (2014.01) |
| *H01L 31/042* | (2014.01) |
| *H02S 20/00* | (2014.01) |
| *H02N 15/00* | (2006.01) |

(52) U.S. Cl.
CPC ............ *H02S 30/10* (2014.12); *H01L 31/042* (2013.01); *H02N 15/00* (2013.01); *H02S 20/00* (2013.01); *H02S 40/22* (2014.12); *Y02E 10/52* (2013.01)

(58) Field of Classification Search
CPC ........ H01L 31/00–31/078; Y02E 10/50–10/60
USPC ................................................ 136/243–265
See application file for complete search history.

(56) References Cited

U.S. PATENT DOCUMENTS

| | | | | | |
|---|---|---|---|---|---|
| 4,687,880 | A | * | 8/1987 | Morris ................ | H01L 31/0547 136/246 |
| 5,427,628 | A | * | 6/1995 | Hartley ............... | H01L 31/0543 136/246 |
| 2007/0240758 | A1 | * | 10/2007 | Spartz .................... | B82Y 20/00 136/256 |
| 2011/0146752 | A1 | * | 6/2011 | Park ........................ | H02S 40/10 136/246 |
| 2014/0224321 | A1 | * | 8/2014 | Lim ................ | H01L 31/022433 136/256 |

(Continued)

FOREIGN PATENT DOCUMENTS

JP 2011114091 * 6/2011

*Primary Examiner* — Bach T Dinh
(74) *Attorney, Agent, or Firm* — The Roy Gross Law Firm, LLC; Roy Gross

(57) ABSTRACT

A three dimensional photovoltaic module that allows for the absorption of solar energy from various angles in a three hundred sixty degree arrangement has a base panel unit and a solar structure. The solar structure has a plurality of solar cells, each having a first photovoltaic cell and a second photovoltaic cell, wherein each of the plurality of solar cells absorbs light from two opposing sides. A concentrated photovoltaic lens directs light and traps light in an interior volume, allowing for internal absorption of light in addition to the external absorption of light. The base panel unit has a rotational base to which the solar structure is connected, and a magnetic base about which the rotational base is magnetically levitated. A plurality of magnets positioned around the rotational base generates a magnetic vortex that in combination with the magnetic base allows the rotational base and the solar structure to rotate.

16 Claims, 15 Drawing Sheets

(56) References Cited

U.S. PATENT DOCUMENTS

2014/0259899 A1\* 9/2014 Poivet .................... A01G 9/243
  47/17

\* cited by examiner

3D PRINTED SOLAR ENERGY

The current application claims a priority to the U.S. Provisional Patent application Ser. No. 62/041,480 filed on Aug. 25, 2014, the U.S. Provisional Patent application Ser. No. 62/130,397 filed on Mar. 9, 2015, and the Provisional Patent application Ser. No. 62/132,256 filed on Mar. 12, 2015.

FIELD OF THE INVENTION

The present invention relates generally to solar energy devices. More specifically, the present invention is a three dimensional photovoltaic module having a plurality of solar cells configured in a polyhedron arrangement, wherein each of the plurality of solar cells absorbs light from a different angle.

BACKGROUND OF THE INVENTION

The sun is the ultimate source of energy, which provides the earth with enough solar energy, such that a mere fraction of the solar energy if efficiently converted into electrical energy will be enough for all human needs. Solar energy becomes more and more efficient, with its low pollution and is one of the unlimited renewable energy resources. It provides an efficient alternative to fossil fuels and also a promising long term solution to solving the energy crisis.

Solar technologies are broadly characterized as either passive solar technology or active solar technology depending on the way they capture, convert and distribute solar energy. Active solar techniques include the use of photovoltaic panels to harness the energy. The light-harvesting process to convert solar energy to electricity comprises two key steps that determine the overall efficiency of the process, namely i) light absorption, and ii) charge collection. The solar panels, or photovoltaic cells, industry is growing at a high pace with a vast market potential.

Two-dimensional flat solar panels are the commonly used panels for solar energy harvesting, these panels being found installed on the roofs of both domestic and commercial properties. But the two-dimensional panel poses certain limitations such as insufficient energy conversion due to the relative lack of direct incident light, especially in high altitude regions. Light at non-normal angles of incidence impacts the efficiency of the flat solar panel, and this is especially apparent not only when considering the sun's movement during its daily cycle, but also the sun's movement during its yearly cycle.

Conventional solar panels comprise lots of small solar cells spread over a large area that can work together to provide enough power thus consuming vast space rendering it difficult to install such solar panels in a variety of commercial setups. In addition to space constraints, reflectivity of the solar cell surface also significantly impairs productivity of the solar panel despite the existing anti-reflectivity coating techniques to overcome reflectivity issues. In addition to space constraints and two dimensional flat panel design, solar panels known in the art pose further limitations due to employment of conventional metallic contact wires and bus bars inside the solar cells.

Therefore, there exists a need in the art for an efficient solar panel design in order to maximize the conversion of sunlight into electricity. It is an object of the present invention to provide a three dimensional photovoltaic module that allows for the absorption of solar energy from various angles in a three hundred sixty degree arrangement. The present invention includes a solar structure having a plurality of solar cells that are positioned about a solar frame in a polyhedron arrangement. Each of the plurality of solar cells is two-sided, wherein each of the plurality of solar cells absorbs light from the exterior of the solar structure and from an interior volume of the solar structure. A concentrated photovoltaic lens directs light into and traps light within the interior volume.

The solar structure is connected to a base panel unit that allows the solar structure to freely rotate in order to cool the solar structure and increase the efficiency of the present invention. The solar structure is connected to a rotational base of the base panel unit, wherein the rotational base is magnetically levitated about a magnetic base that allows for the rotation of the solar structure. Furthermore, a plurality of acoustic levitation modules stabilizes the levitation of the rotational base about the magnetic base. A module support structure is also provided to allow for the optimal positioning of multiple three dimensional photovoltaic modules.

DETAIL DESCRIPTIONS OF THE INVENTION

All illustrations of the drawings are for the purpose of describing selected versions of the present invention and are not intended to limit the scope of the present invention.

The present invention is a three dimensional photovoltaic module that allows for the absorption of solar energy from various angles in a three hundred sixty degree arrangement. In reference to FIG. 1, the three dimensional photovoltaic module comprises a base panel unit 1, a solar structure 2, a module support structure 4, and a plurality of acoustic levitation modules 3. The solar structure 2 provides the components for absorbing light and converting the said light to electrical current. The solar structure 2 is supported by the base panel unit 1, which is in turn supported by the module support structure 4. The plurality of acoustic levitation modules 3 assist in stabilizing the solar structure 2 and the base panel unit 1.

Figure 3:
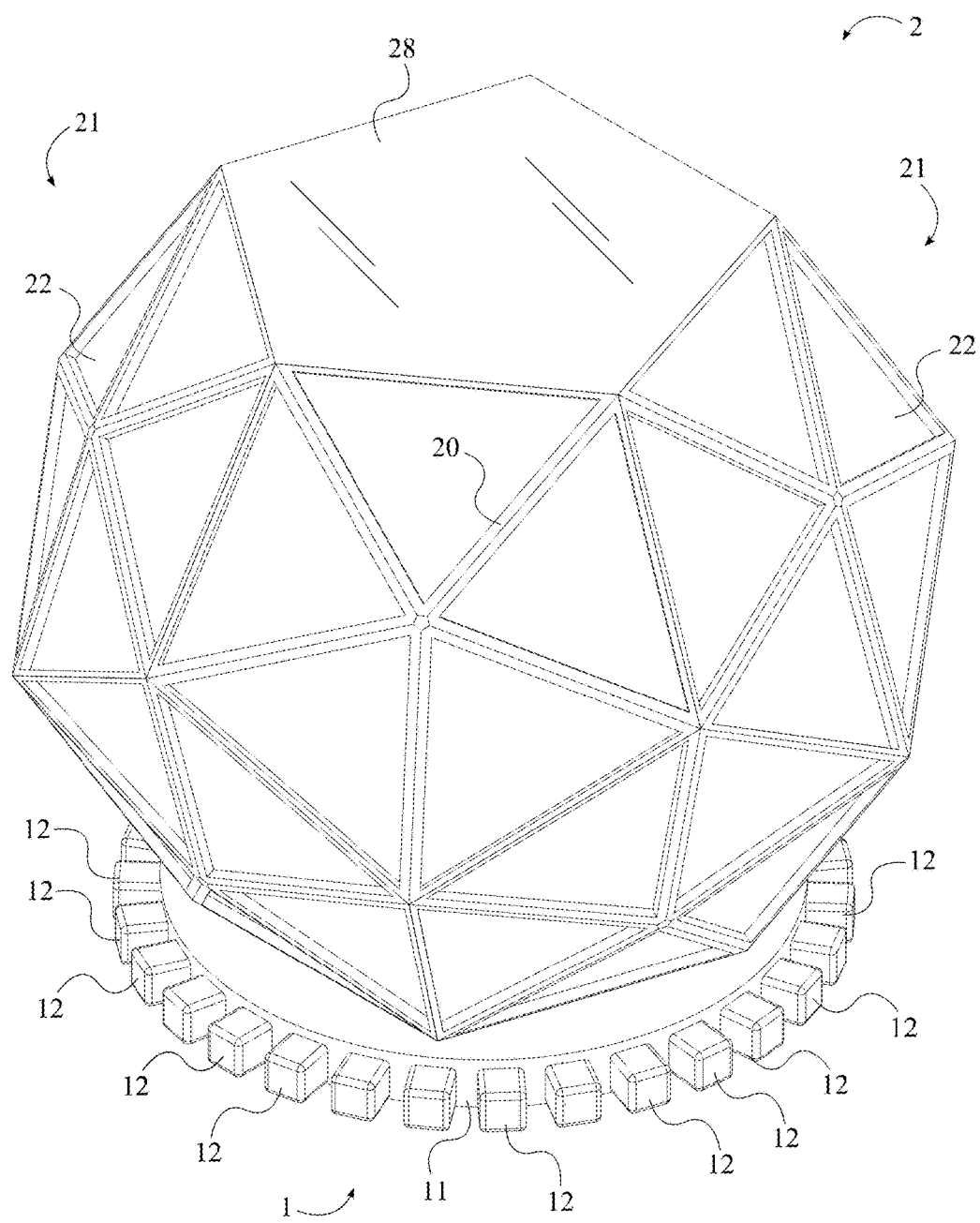
FIG. 3 is a perspective view of the solar structure connected to the rotational base, wherein the concentrated photovoltaic lens is in place.
Figure 4:
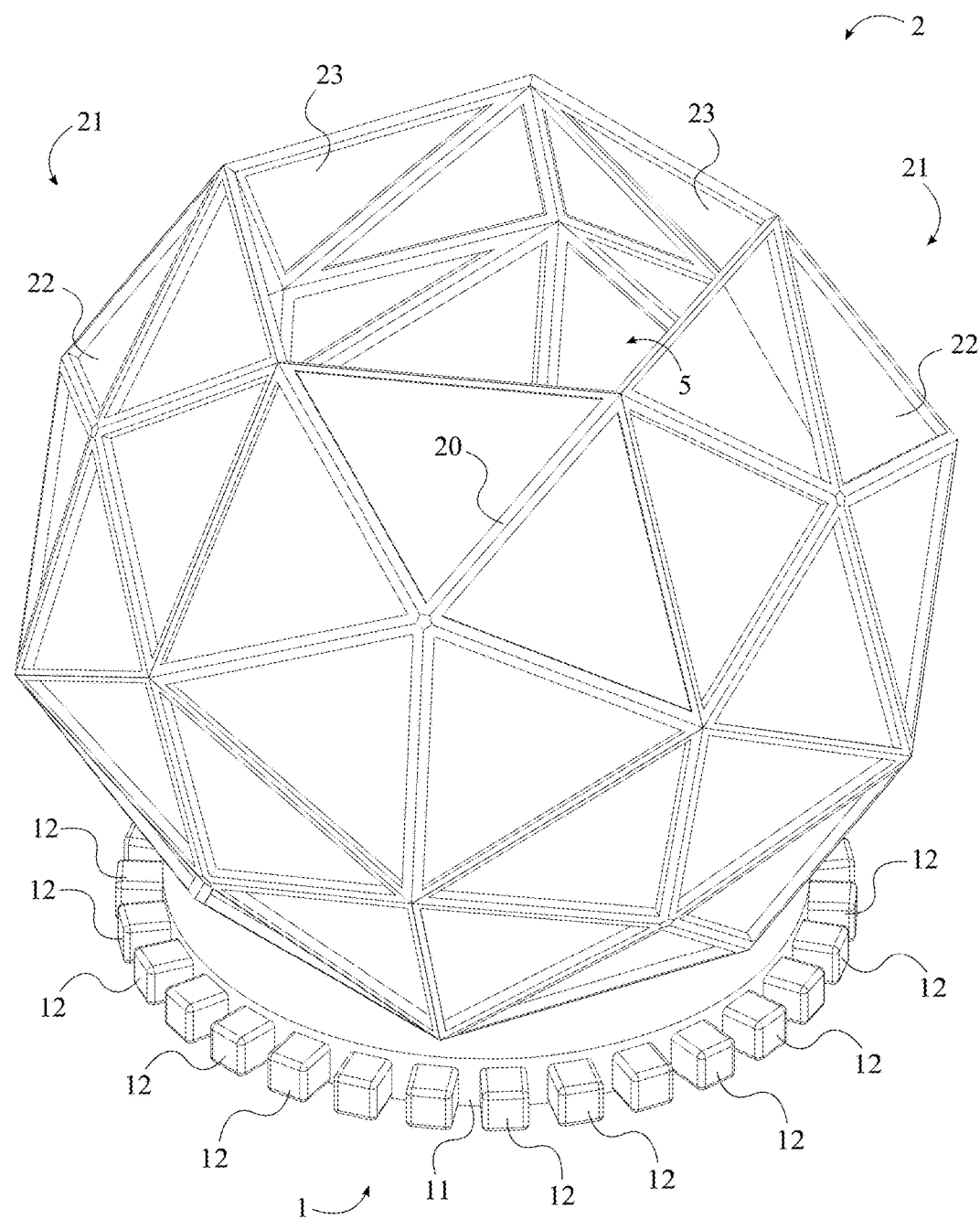
FIG. 4 is a perspective view of the solar structure connected to the rotational base, wherein the concentrated photovoltaic lens is removed.

In reference to FIG. 3-4, the solar structure 2 is adjacently connected to the base panel unit 1 and comprises a solar frame 20, a plurality of solar cells 21, and a concentrated photovoltaic lens 28. The solar frame 20 supports the plurality of solar cells 21 and defines the overall shape of the solar structure 2. The solar frame 20 is a framework that delineates a plurality of open spaces into which the plurality of solar cells 21 is positioned. Each of the plurality of solar cells 21 is perimetrically connected to the solar frame 20, wherein the plurality of solar cells 21 is distributed in a polyhedron arrangement. In the preferred embodiment of the present invention, each of the plurality of solar cells 21 is triangular, however, it is possible for the plurality of solar cells 21 to be differently shaped in other embodiments of the present invention.

In reference to FIG. 3, similar to each of the plurality of solar cells 21, the concentrated photovoltaic lens 28 is perimetrically connected to the solar frame 20. The concentrated photovoltaic lens 28 is positioned about the solar frame 20 opposite the base panel unit 1, wherein the concentrated photovoltaic lens 28 is positioned about the top of the solar frame 20. Together the solar structure 2 and the base panel unit 1 delineate an interior volume 5 as depicted in FIG. 4, wherein the concentrated photovoltaic lens 28 allows light to travel through the solar structure 2 into the interior volume 5. The concentrated photovoltaic lens 28 focuses the light, and traps the light within the interior volume 5. In the preferred embodiment of the present invention, the concentrated photovoltaic lens 28 is a Fresnel lens, however, other types of lenses may be used in other embodiments of the present invention. Furthermore, in the preferred embodiment of the present invention, the solar frame 20 is transparent, wherein light is able to pass through the solar frame 20 into the interior volume 5.

Each of the plurality of solar cells 21 is designed to absorb light from two sides, wherein each of the plurality of solar cells 21 comprises a first photovoltaic cell 22. In the preferred embodiment of the present invention, the first photovoltaic cell 22 is designed to absorb light through two opposing sides. In this way, the first photovoltaic cell 22 is able to absorb sun light from the exterior of the solar structure 2, as well as sun light from the interior volume 5 that is distributed through the concentrated photovoltaic lens 28.

Figure 6:
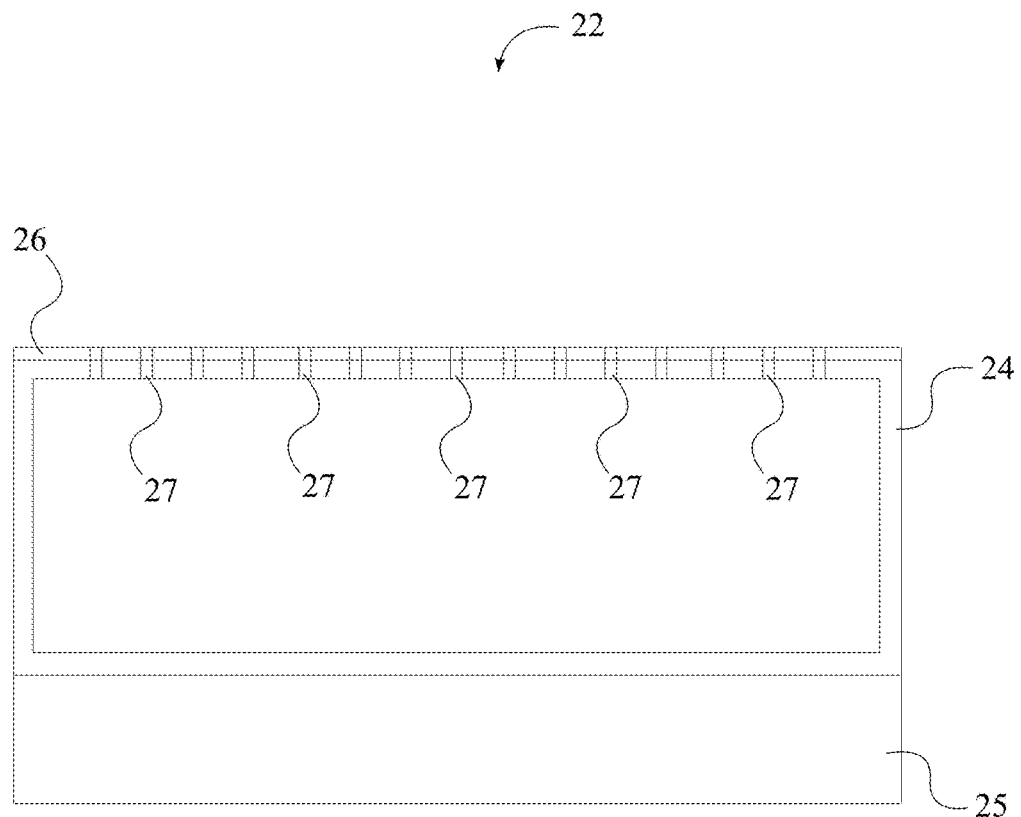
FIG. 6 is a sectional view of the first photovoltaic cell for each of the plurality of solar cells.

In reference to FIG. 6, the first photovoltaic cell 22 comprises an absorption wafer 24, a contact layer 25, and a subsequent contact 26. The absorption wafer 24 is a semiconductor that absorbs light energy and provides a p-n junction to generate an electric current. The absorption wafer 24 can provide a single-junction or multi-junctions depending on the embodiment and desired usage of the present invention. In the preferred embodiment of the present invention, the absorption wafer 24 is a crystalline silicone that provides a single-junction, however, in other embodiments of the present invention, the absorption wafer 24 may also be a thin film technology, multiple thin film technologies forming a multi-junction, or other photovoltaic material.

In further reference to FIG. 6, the subsequent contact 26 is positioned on the absorption wafer 24 opposite the contact layer 25, wherein the subsequent contact 26 completes a circuit with the contact layer 25. In the preferred embodiment of the present invention, the subsequent contact 26 is a plurality of nanomaterials that includes copper nanowire, liquid metallic carbon nanotubes, and other nanoparticles. The plurality of nanomaterials acts to further increase the absorption of light and thus increase the overall efficiency of each of the plurality of solar cells 21. In the preferred embodiment of the present invention, the plurality of nanomaterials is applied to the absorption wafer 24 by placing the absorption wafer 24 in a sealed chamber and creating a tornado like vortex of nanoparticles, wherein the nanoparticles are dispersed about and attached to the absorption wafer 24.

The contact layer 25 is a transparent metal oxide or similar material that is applied to the absorption wafer 24 that allows light to pass through to the absorption wafer 24 in addition to serving as a contact. In the preferred embodiment of the present invention, the contact layer 25 is positioned adjacent to the interior volume 5, wherein the subsequent contact 26 is on the exterior of the solar structure 2. However, it is possible for the first photovoltaic cell 22 to be flipped in other embodiments of the present invention, wherein the subsequent contact 26 is positioned adjacent to the interior volume 5 and the contact layer 25 is positioned about the exterior of the solar structure 2.

In other embodiments of the present invention, a contact other than the plurality of nanomaterials may be used as the subsequent contact 26. The subsequent contact 26 is positioned about the absorption wafer 24 opposite the contact layer 25, wherein the absorption wafer 24 is sandwiched in between the contact layer 25 and the subsequent contact 26. In one embodiment, the subsequent contact 26 comprises a plurality of busbars and a plurality of contact wires; the plurality of busbars and the plurality of contact wires being linearly distributed about absorption wafer 24. In another embodiment, the subsequent contact 26 is formed from printed electronics. The contact layer 25 and the subsequent contact 26 provide the means for cycling electrical current through a circuit.

In some embodiments of the present invention, the first photovoltaic cell 22 further comprises a plurality of nanoscale pores 27, as depicted in FIG. 6. The plurality of nanoscale pores 27 traverses into the absorption wafer 24 and act to reduce the reflectivity of the absorption wafer 24. Furthermore, the plurality of nanoscale pores 27 allows for the penetration of photons inside the first photovoltaic cell 22 and promotes the bouncing of photons to generate increased electrical power.

The first photovoltaic cell 22 may also be piranha etched in some embodiments of the present invention. More specifically, the plurality of nanomaterials is piranha etched. A piranha solution, being a mixture of sulfuric acid and hydrogen peroxide, is used to clean organic residues off of the plurality of nanomaterials.

In alternative embodiments of the present invention, each of the plurality of solar cells 21 further comprises a second photovoltaic cell 23, wherein the first photovoltaic cell 22 and the second photovoltaic cell 23 absorb light from different side of the solar structure 2. In reference to FIG. 4, the second photovoltaic cell 23 of each of the plurality of solar cells 21 is positioned adjacent to the interior volume 5, wherein the second photovoltaic cell 23 of each of the plurality of solar cells 21 absorbs light scattered within the interior volume 5 through the concentrated photovoltaic lens 28. The first photovoltaic cell 22 is positioned adjacent to the second photovoltaic cell 23 opposite the interior volume 5 for each of the plurality of solar cells 21, wherein the first photovoltaic cell 22 absorbs light about the exterior of the solar structure 2.

Figure 7:
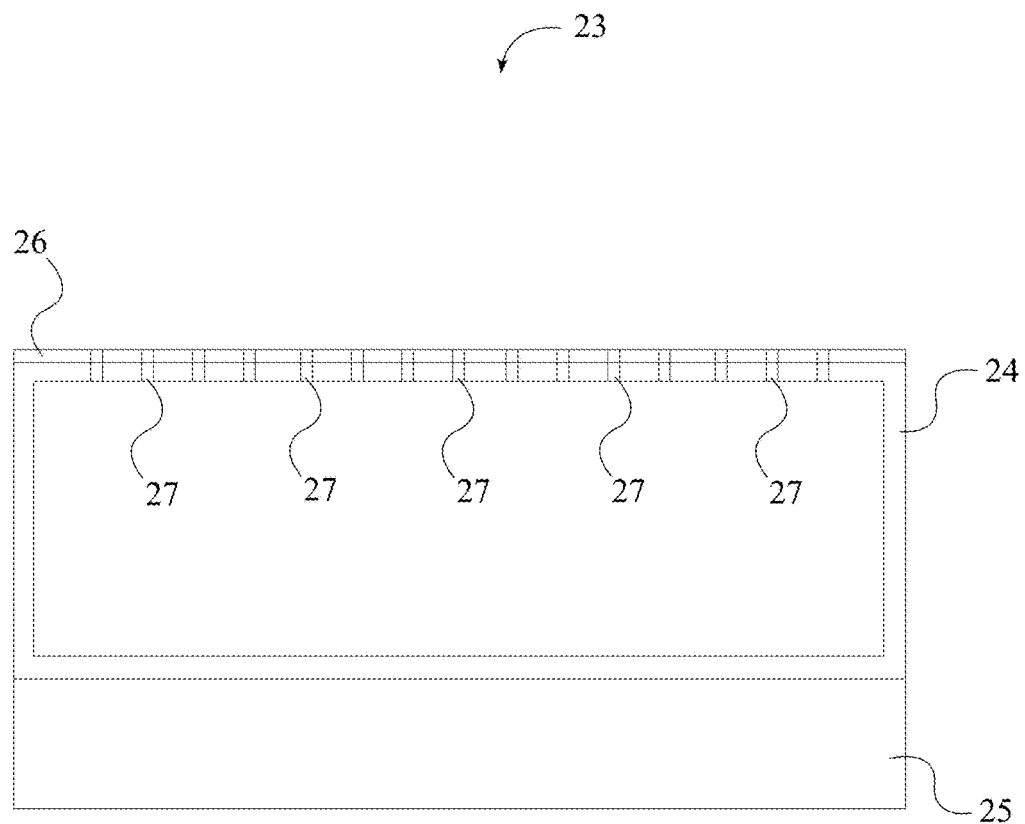
FIG. 7 is a sectional view of the second photovoltaic cell for each of the plurality of solar cells.

In reference to FIG. 7, the second photovoltaic cell 23 comprises an absorption wafer 24, a contact layer 25, and a subsequent contact 26. The absorption wafer 24 of the second photovoltaic cell 23 is a semiconductor that absorbs light energy and provides a p-n junction to generate an electric current. The absorption wafer 24 of the second photovoltaic cell 23 can provide a single-junction or multi-junctions depending on the embodiment and desired usage of the present invention. In the preferred embodiment of the present invention, the absorption wafer 24 of the second photovoltaic cell 23 is a crystalline silicone that provides a single-junction, however, in other embodiments of the present invention, the absorption wafer 24 of the second photovoltaic cell 23 may also be a thin film technology, multiple thin film technologies forming a multi-junction, or other photovoltaic material.

In further reference to FIG. 7, the subsequent contact 26 of the second photovoltaic cell 23 is positioned on the absorption wafer 24 of the second photovoltaic cell 23 opposite the contact layer 25 of the second photovoltaic cell 23, wherein the subsequent contact 26 of the second photovoltaic cell 23 completes a circuit with the contact layer 25 of the second photovoltaic cell 23. In the preferred embodiment of the present invention, the subsequent contact 26 of the second photovoltaic cell 23 is a plurality of nanomaterials that includes copper nanowire, liquid metallic carbon nanotubes, and other nanoparticles. The plurality of nanomaterials of the second photovoltaic cell 23 acts to further increase the absorption of light and thus increase the overall efficiency of each of the plurality of solar cells 21. In the preferred embodiment of the present invention, the plurality of nanomaterials of the second photovoltaic cell 23 is applied to the absorption wafer 24 of the second photovoltaic cell 23 by placing the absorption wafer 24 of the second photovoltaic cell 23 in a sealed chamber and creating a tornado like vortex of nanoparticles, wherein the nanoparticles are dispersed about and attached to the absorption wafer 24.

The contact layer 25 of the second photovoltaic cell 23 is an opaque or transparent metal oxide, or similar material, that is applied to the absorption wafer 24 of the second photovoltaic cell 23 and serves as a contact. Similarly, the contact layer 25 of the first photovoltaic cell 22 may also be opaque. The contact layer 25 of the second photovoltaic cell 23 is positioned adjacent to the contact layer of the first photovoltaic cell 22. In this way the subsequent contact 26 of the first photovoltaic cell 22 is on the exterior of the solar structure 2, while the subsequent contact 26 of the second photovoltaic cell 23 is on the interior of the solar structure 2, adjacent to the interior volume 5.

In other embodiments of the present invention, a contact other than the plurality of nanomaterials may be used as the subsequent contact 26 of the second photovoltaic cell 23. The subsequent contact 26 of the second photovoltaic cell 23 is positioned about the absorption wafer 24 of the second photovoltaic cell 23 opposite the contact layer 25 of the second photovoltaic cell 23, wherein the absorption wafer 24 of the second photovoltaic cell 23 is sandwiched in between the contact layer 25 of the second photovoltaic cell 23 and the subsequent contact 26 of the second photovoltaic cell 23. In one embodiment, the subsequent contact 26 of the second photovoltaic cell 23 comprises a plurality of busbars and a plurality of contact wires; the plurality of busbars of the second photovoltaic cell 23 and the plurality of contact wires of the second photovoltaic cell 23 being linearly distributed about absorption wafer 24 of the second photovoltaic cell 23. In another embodiment, the contact layer 25 of the second photovoltaic cell 23 and the subsequent contact 26 of the second photovoltaic cell 23 provide the means for cycling electrical current through a circuit.

In some embodiments of the present invention, the second photovoltaic cell 23 further comprises a plurality of nanoscale pores 27, as depicted in FIG. 7. The plurality of nanoscale pores 27 of the second photovoltaic cell 23 traverses into the absorption wafer 24 of the second photovoltaic cell 23 and act to reduce the reflectivity of the absorption wafer 24 of the second photovoltaic cell 23. Furthermore, the plurality of nanoscale pores 27 of the second photovoltaic cell 23 allows for the penetration of photons inside the second photovoltaic cell 23 and promotes the bouncing of photons to generate increased electrical power.

The second photovoltaic cell 23 may also be piranha etched in some embodiments of the present invention. More specifically, the plurality of nanomaterials of the second photovoltaic cell 23 is piranha etched. A piranha solution, being a mixture of sulfuric acid and hydrogen peroxide, is used to clean organic residues off of the plurality of nanomaterials of the second photovoltaic cell 23.

Figure 1:
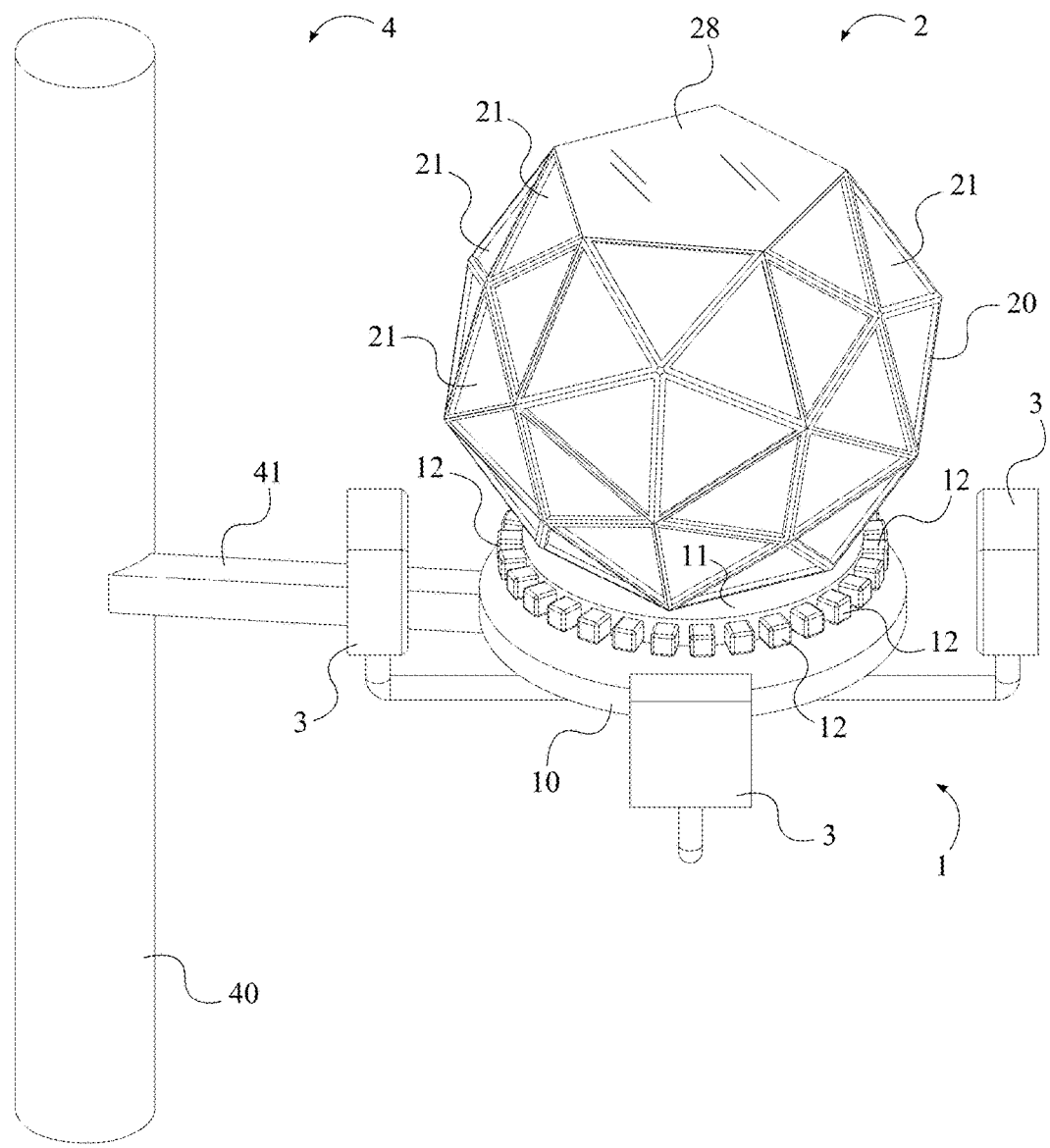
FIG. 1 is a perspective view of the present invention, showing the base panel unit, the solar structure, the module support structure, and the plurality of acoustic levitation modules.
Figure 2:
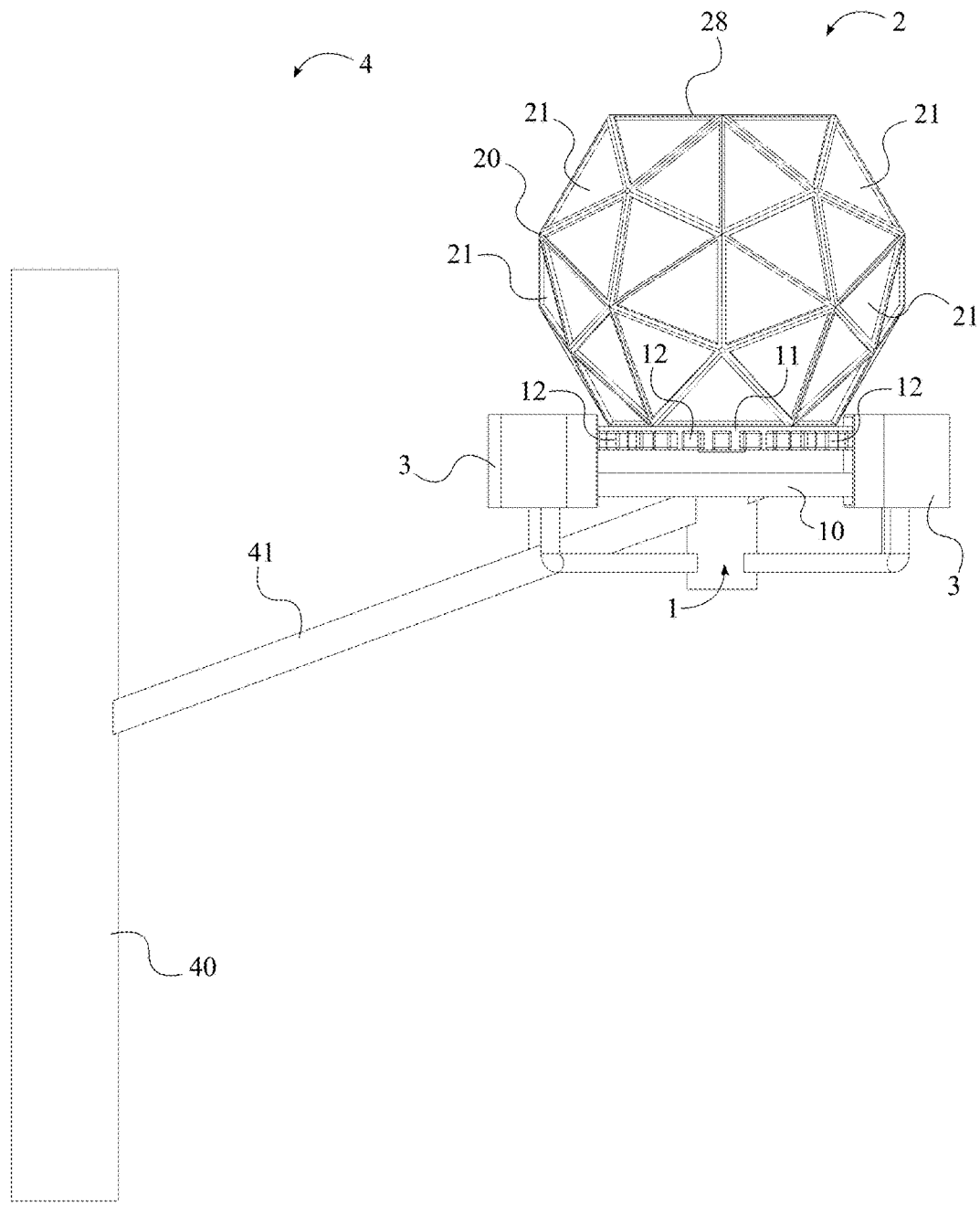
FIG. 2 is a front elevational view of the present invention, wherein the rotational base is magnetically levitated above the magnetic base.
Figure 8:
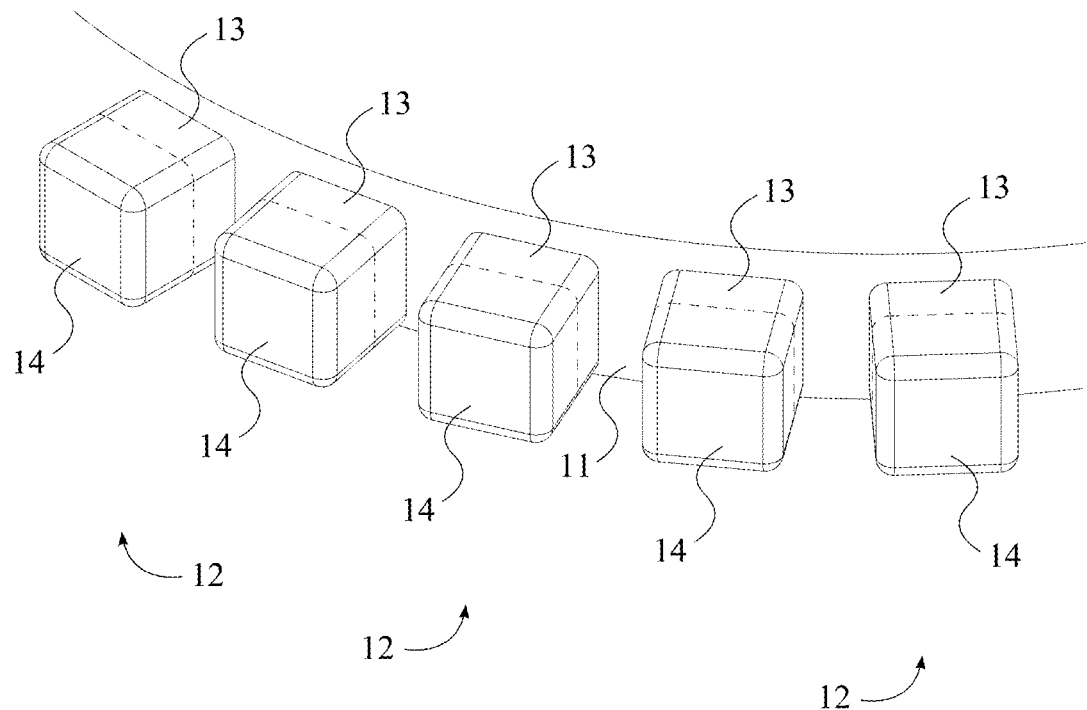
FIG. 8 is a section view of the rotational base and the plurality of magnets, depicting the first pole and the second pole of each of the plurality of magnets.

In reference to FIG. 1-2, the base panel unit 1 comprises a magnetic base 10, a rotational base 11, and a plurality of magnets 12. The solar structure 2 is adjacently connected to the rotational base 11, while each of the plurality of magnets 12 is adjacently connected to the rotational base 11. The plurality of magnets 12 is perimetrically positioned about the rotational base 11, wherein the plurality of magnets 12 is evenly dispersed around the rotational base 11. Furthermore, each of the plurality of magnets 12 comprises a first pole 13 and a second pole 14; the first pole 13 being a North pole and the second pole 14 being a South pole, or vice versa. The first pole 13 is positioned in between the rotational base 11 and the second pole 14, as depicted in FIG. 8. The first pole 13 has a magnetic field directed out, towards the rotational base 11, while the second pole 14 has a magnetic field directed out, away from the magnetic base 10. The identical orientation of each of the plurality of magnets 12 causes the magnetic field of the first pole 13 and the second pole 14 of adjacent magnets to repel each other, thus forming a magnetic vortex.

Figure 11:
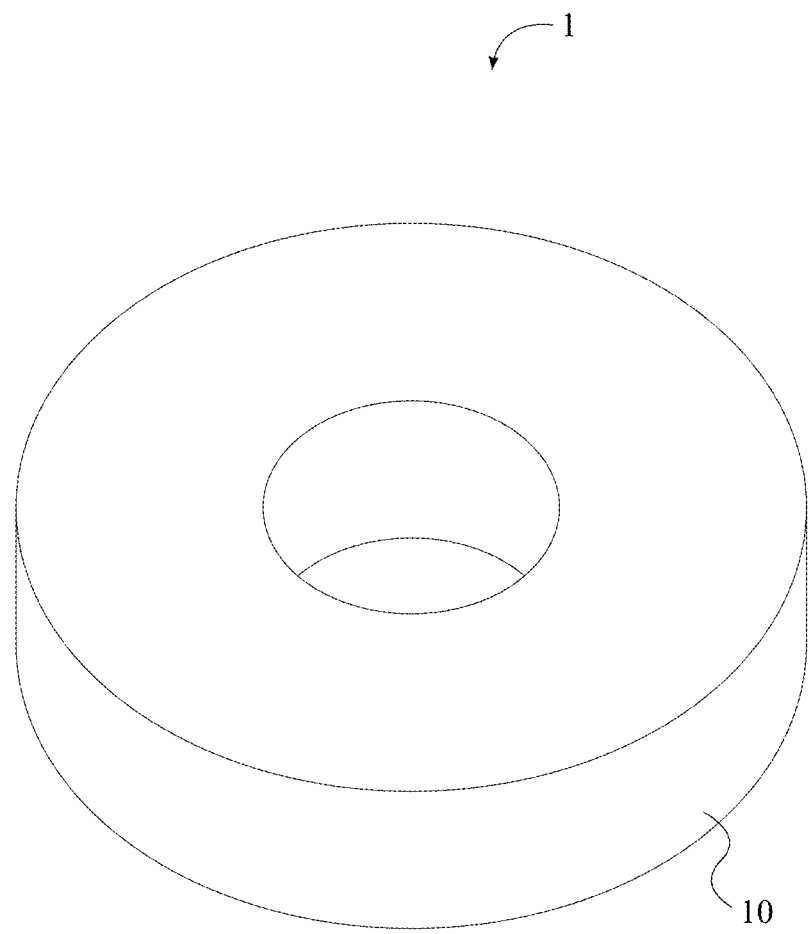
FIG. 11 is a perspective view of the magnetic base of the base panel unit, wherein the magnetic base has a center hole for creating a magnetic vortex.

In reference to FIG. 2, the rotational base 11 is positioned in between the magnetic base 10 and the solar structure 2, wherein the rotational base 11 is suspended above and/or around the magnetic base 10. The magnetic base 10 provides a magnetic force to levitate the rotational base 11 at a fixed distance from the magnetic base 10. The orientation of the plurality of magnets 12 about the rotational base 11 induces the magnetic vortex that, in turn with the magnetic force of the magnetic base 10, causes the rotational base 11, and subsequently the solar structure 2, to spin around a vertical axis. Furthermore, the magnetic base 10 has a center hole, as shown in FIG. 11, to facilitate the magnetic vortex. The spin of the rotational base 11 and the solar structure 2 acts to cool the solar structure 2 and thus increase the efficiency of the present invention.

Figure 5:
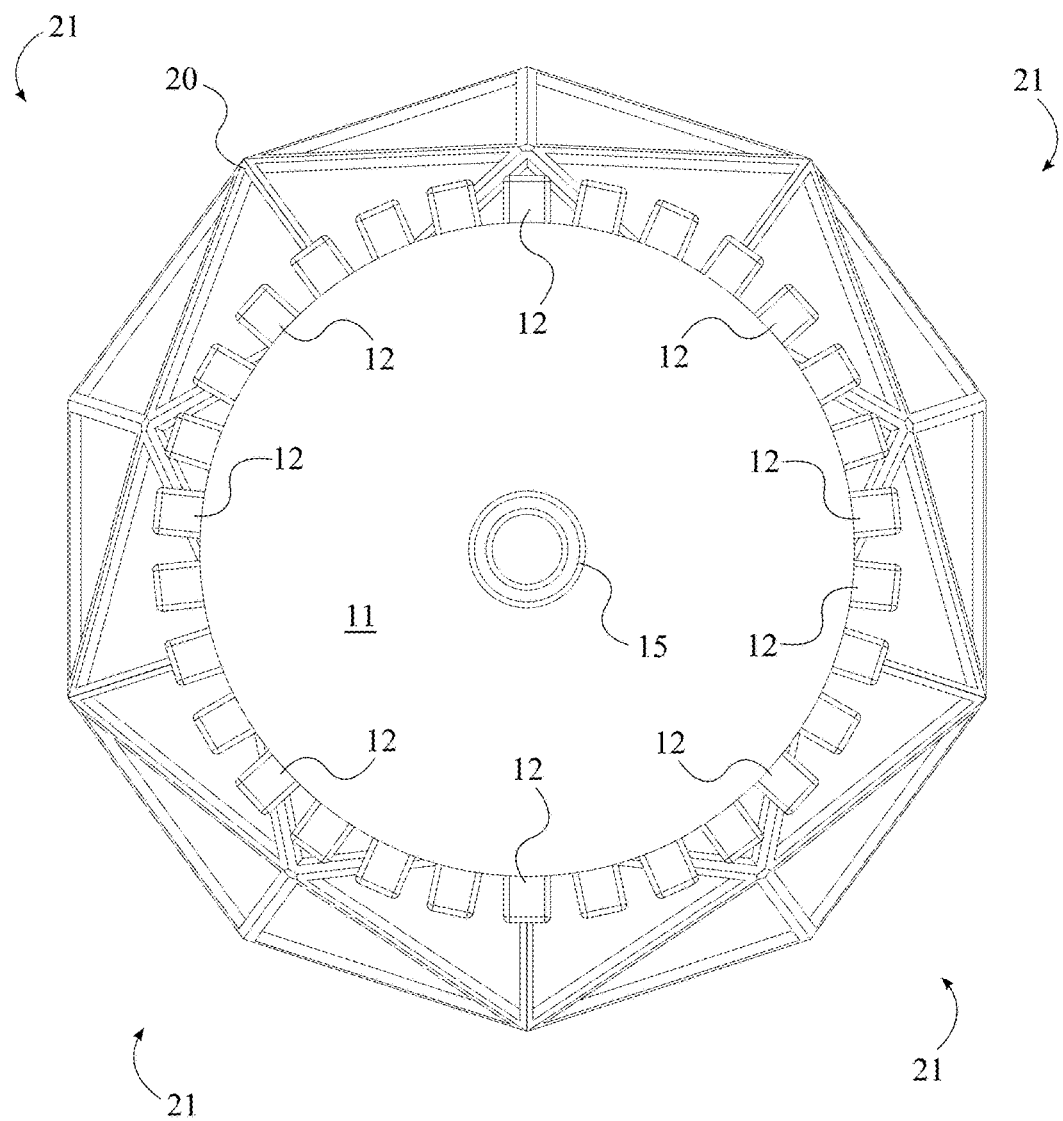
FIG. 5 is a bottom plan view of the rotational base and the solar structure.

In reference to FIG. 5, the base panel unit 1 further comprises a ball bearing 15 that is positioned through the rotational base 11, wherein the ball bearing 15 is concentrically positioned with the rotational base 11. The ball bearing 15 provides a means for an opening through which electrical wires can be positioned such that the electrical wires do not become twisted as the rotational base 11 and the solar structure 2 spin about the magnetic base 10. The electrical wires are used to connect each of the plurality of solar cells 21 to batteries, power lines, inverters, etc.

Figure 12:
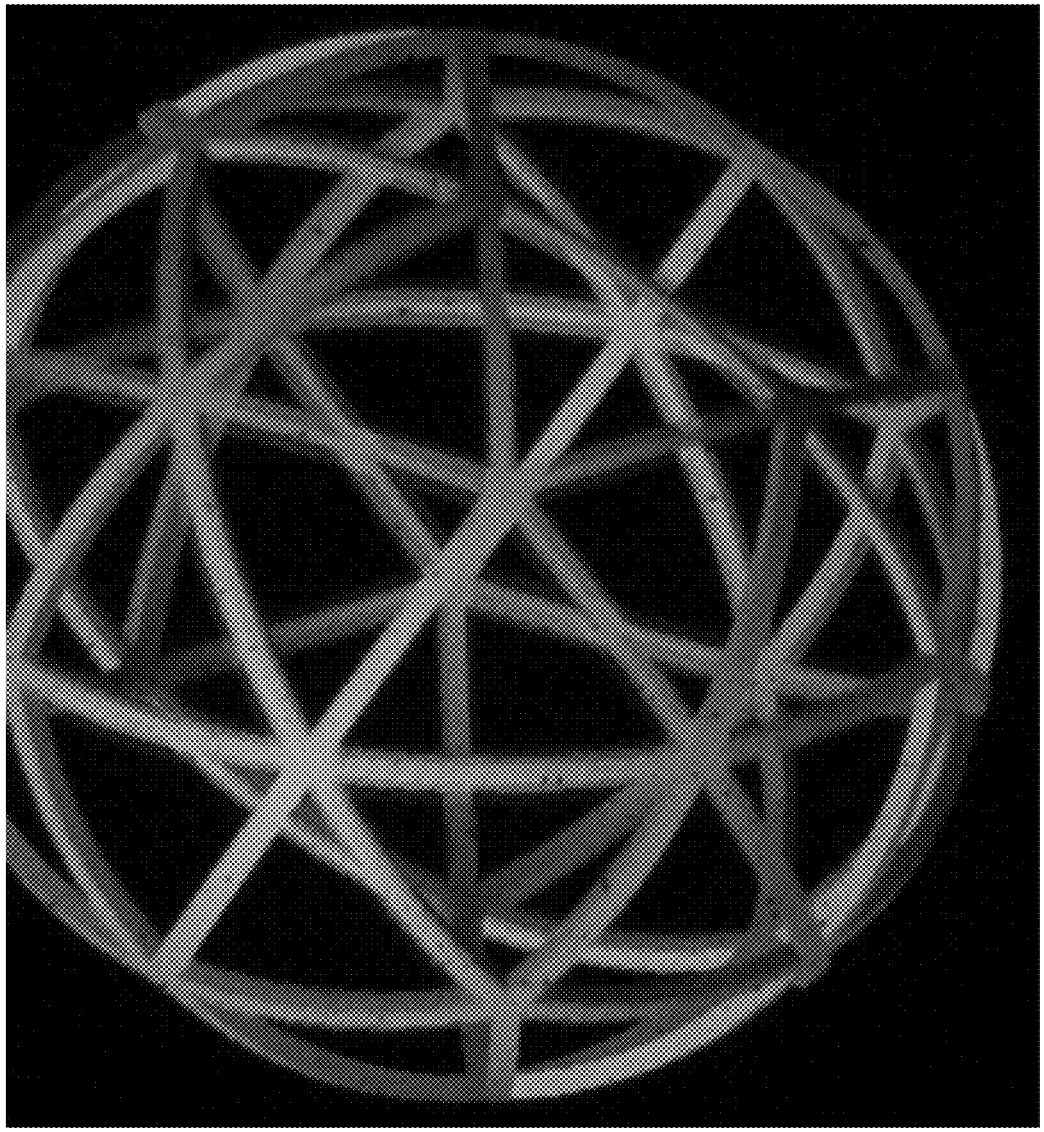
FIG. 12 is a perspective view of the solar frame, wherein the solar frame is spherical to reduce drag as the solar structure rotates.
Figure 13:
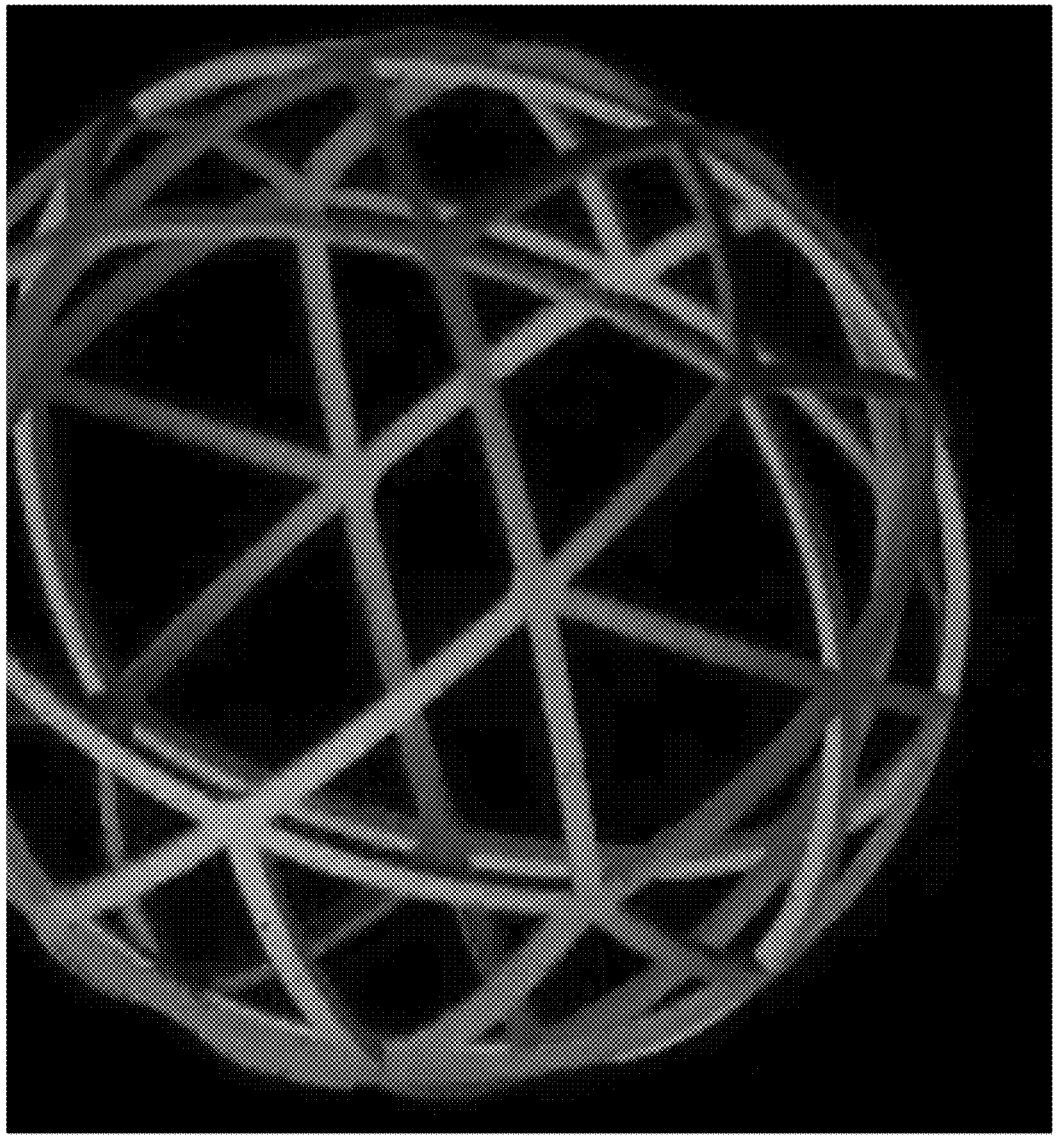
FIG. 13 is another perspective view of the solar frame having the spherical shape.
Figure 14:
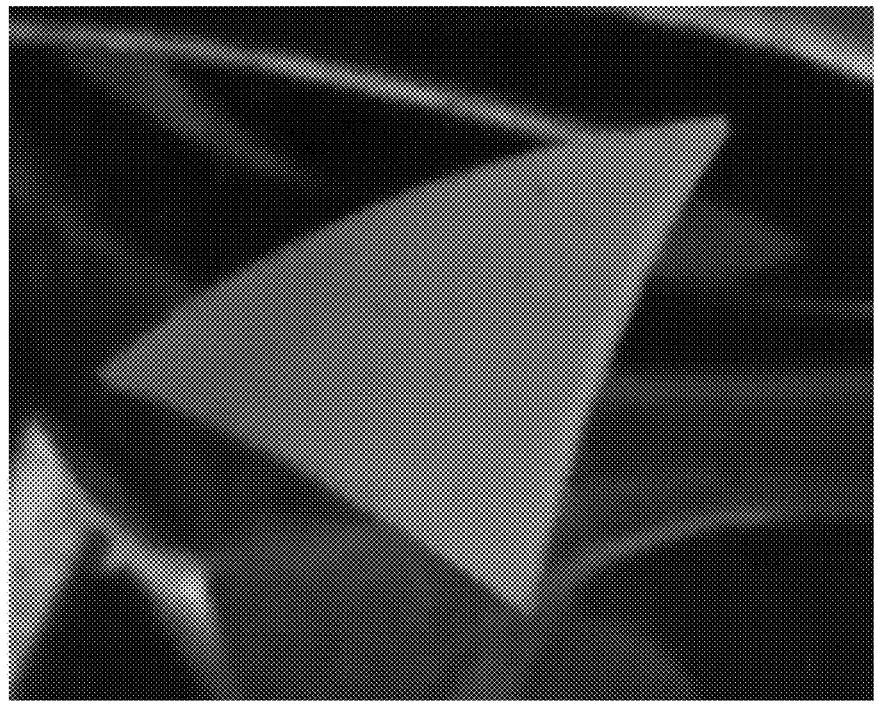
FIG. 14 is a perspective view of on the plurality of solar cells being curved to fit the spherical shape of the solar frame.
Figure 15:
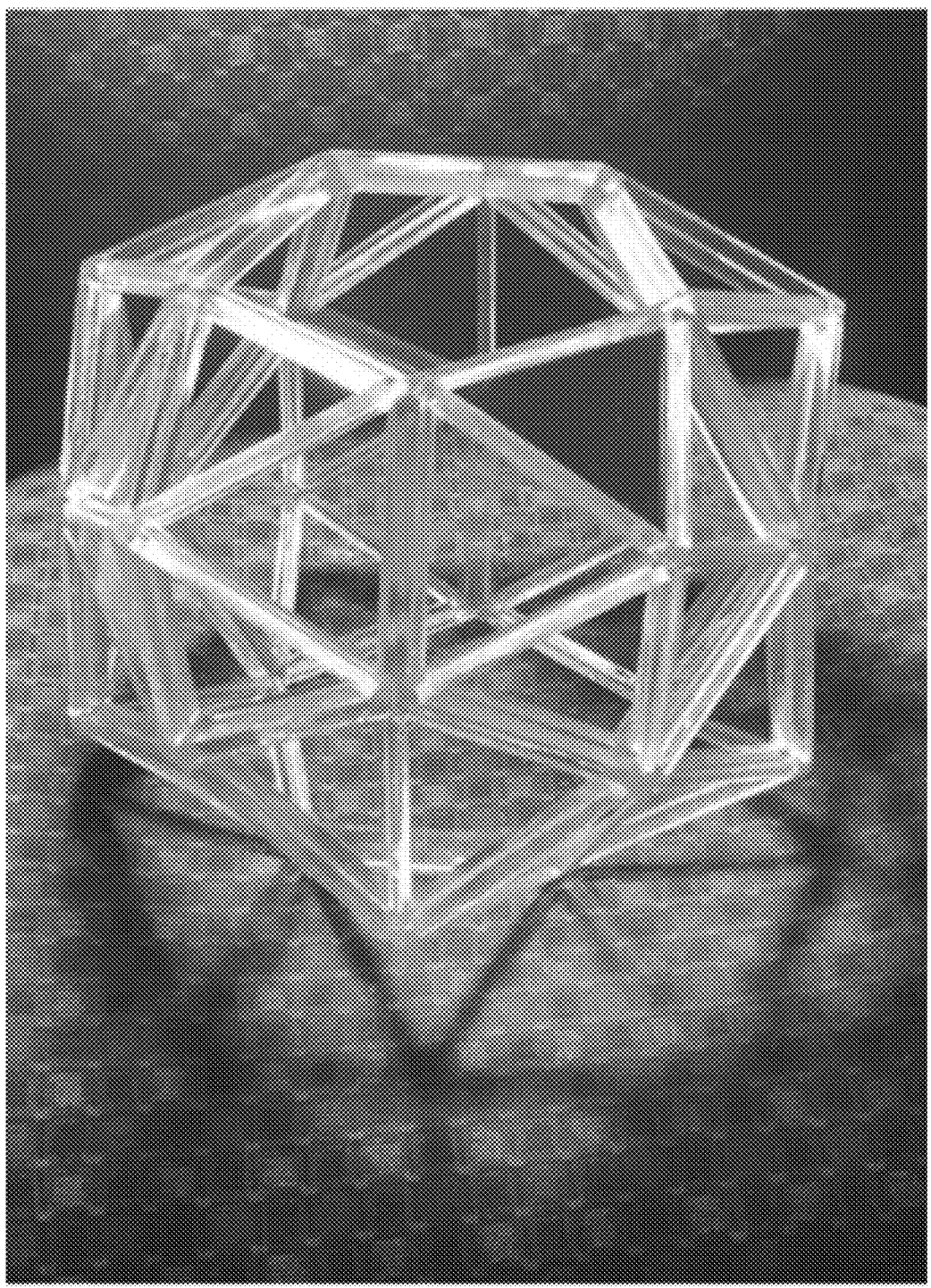
FIG. 15 is a perspective view of on the plurality of solar cells of a polyhedron arrangement.

In reference to FIG. 12-14, in the preferred embodiment of the present invention the solar structure 2 is spherical in shape, thus the solar frame 20 is designed to have no angles. Additionally, each of the plurality of solar cells 21 is curved in order to match the contour of the solar frame 20. The spherical design of the solar structure 2 is ideal as it reduces the drag of the solar structure 2, as the solar structure 2 rotates.

Figure 9:
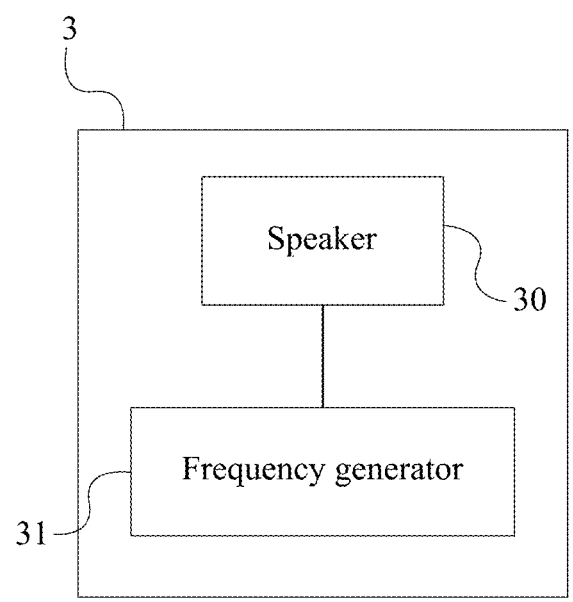
FIG. 9 is a diagram depicting the electrical connection between the speaker and the frequency generator of each of the plurality of acoustic levitation modules.

In reference to FIG. 1, the plurality of acoustic levitation modules 3 is perimetrically positioned around the base panel unit 1, wherein the plurality of acoustic levitation modules 3 is used to stabilize the rotational base 11 as the rotational base 11 levitates and spins above the magnetic base 10. Each of the plurality of acoustic levitation modules 3 comprises a speaker 30 and a frequency generator 31, wherein the frequency generator 31 is electrically connected to the speaker 30, as depicted in FIG. 9. The speaker 30 of each of the plurality of acoustic levitation modules 3 is oriented towards the base panel unit 1, wherein the speaker 30 produces and directs sounds waves towards the base panel unit 1 at a frequency determined by the frequency generator 31. The plurality of acoustic levitation modules 3 uses acoustic radiation pressure to controllably move the rotational base 11 and the solar structure 2 as the rotational base 11 and the solar structure 2 hover about the magnetic base 10.

In reference to FIG. 1-2, the module support structure 4 provides a mount to which the base panel unit 1 is adjacently connected, wherein the module support structure 4 raises the base panel unit 1, and in turn the solar structure 2, wherein the solar structure 2 can be optimally positioned as to receive maximum light exposure. The module support structure 4 comprises a main support 40 and a branch 41, wherein the branch 41 is terminally connected to the main support 40. The base panel unit 1 is adjacently connected to the branch 41 opposite the main support 40; more specifically, the magnetic base 10 is adjacently connected to the module support structure 4.

The module support structure 4 also allows multiple three dimensional photovoltaic modules to be supported in one location. A plurality of subsequent branches can also be terminally connected to the main support 40, wherein each of the plurality of subsequent branches supports a subsequent base panel unit 1 and a subsequent solar structure 2. The plurality of subsequent branches can each be of different lengths and are staggered in order to optimally positioned each of the three dimensional photovoltaic modules, such that each of the three dimensional photovoltaic modules receives maximum light exposure. This is turn increases the efficiency of using multiple three dimensional photovoltaic modules at one time.

Figure 10:
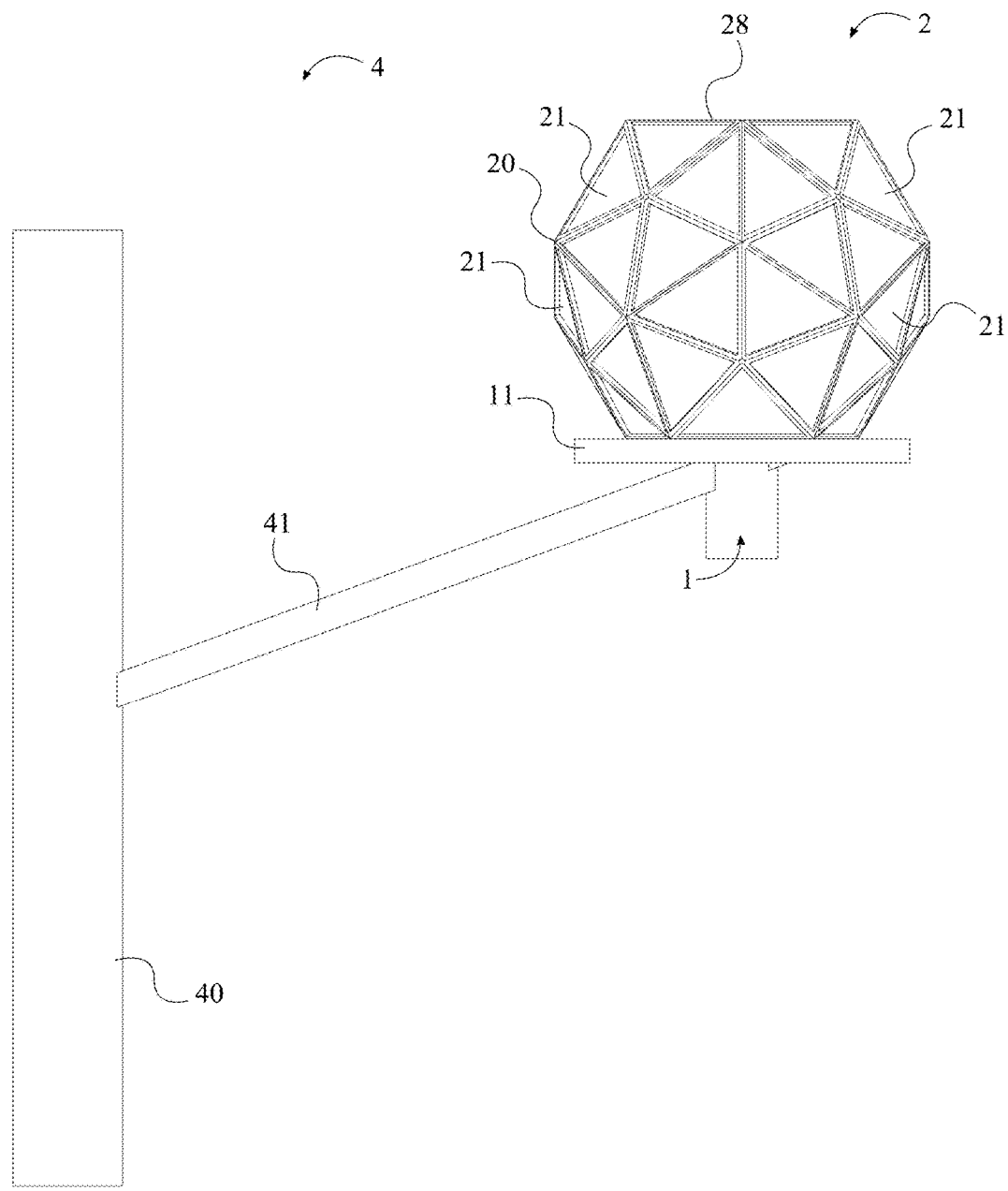
FIG. 10 is a perspective view of the present invention, wherein the rotational base is directly connected to the module support structure.

In reference to FIG. 10, in other embodiments of the present invention, the magnetic base 10 may be excluded, wherein the rotational base 11 is rotatably connected to the module support structure 4. A rotational base 11 is terminally connected to the drive shaft of a motor, wherein the motor is used to drive rotation of the rotational base 11 and the solar structure 2. The motor can be powered directly from the solar structure 2, or the secondary power source can be used to power the motor.

Although the invention has been explained in relation to its preferred embodiment, it is to be understood that many other possible modifications and variations can be made without departing from the spirit and scope of the invention as hereinafter claimed.

What is claimed is:

1. A three dimensional photovoltaic module comprising:
   a base panel unit;
   a solar structure having a polyhedron shape;
   the solar structure comprises a solar frame, a plurality of solar cells, and a concentrated photovoltaic lens having a pentagonal shape;
   each of the plurality of solar cells comprises a first photovoltaic cell;
   the solar structure being adjacently connected to the base panel unit;
   each of the plurality of solar cells being perimetrically connected to the solar frame in a polyhedron arrangement;
   the concentrated photovoltaics lens being perimetrically connected to the solar frame;
   the concentrated photovoltaics lens being positioned about the solar frame opposite the base panel unit; and
   the base panel unit and the solar structure delineating an interior volume having a polyhedron shape.

2. The three dimensional photovoltaic module as claimed in claim 1 comprises:
   each of the plurality of solar cells further comprises a second photovoltaic cell;
   the second photovoltaic cell of each of the plurality of solar cells being positioned adjacent to the interior volume; and
   the first photovoltaic cell being positioned adjacent to the second photovoltaic cell opposite the interior volume.

3. The three dimensional photovoltaic module as claimed in claim 1, wherein the solar frame is transparent.

4. The three dimensional photovoltaic module as claimed in claim 1 comprises:
   the first photovoltaic cell comprises a plurality of nanoscale pores and an absorption wafer; and
   the plurality of nanoscale pores traversing into the absorption wafer.

5. The three dimensional photovoltaic module as claimed in claim 1 comprises:
   the first photovoltaic cell comprises an absorption wafer, a contact layer, and a subsequent contact; and
   the subsequent contact being positioned on the absorption wafer opposite the contact layer.

6. The three dimensional photovoltaic module as claimed in claim 5, wherein the subsequent contact is a plurality of nanomaterials.

7. The three dimensional photovoltaic module as claimed in claim 6, wherein the plurality of nanomaterials is piranha etched.

8. The three dimensional photovoltaic module as claimed in claim 1 comprises:
   each of the plurality of solar cells further comprises a second photovoltaic cell;
   the second photovoltaic cell comprises a plurality of nanoscale pores and an absorption wafer; and
   the plurality of nanoscale pores traversing into the absorption wafer.

9. The three dimensional photovoltaic module as claimed in claim 1 comprises:

the base panel unit comprises a magnetic base, a rotational base, and a plurality of magnets;
the solar structure being adjacently connected to the rotational base;
the plurality of magnets being perimetrically positioned about the rotational base; and
the rotational base being positioned in between the solar structure and the magnetic base.

10. The three dimensional photovoltaic module as claimed in claim 9 comprises:
each of the plurality of magnets comprises a first pole and second pole; and
the first pole being positioned in between the rotational base and the second pole.

11. The three dimensional photovoltaic module as claimed in claim 9, wherein the plurality of magnets is evenly dispersed around the rotational base.

12. A three dimensional photovoltaic module comprising:
a base panel unit;
a solar structure;
the solar structure comprises a solar frame, a plurality of solar cells, and a concentrated photovoltaic lens;
each of the plurality of solar cells comprises a first photovoltaic cell;
the solar structure being adjacently connected to the base panel unit;
each of the plurality of solar cells being perimetrically connected to the solar frame;
the concentrated photovoltaics lens being perimetrically connected to the solar frame;
the concentrated photovoltaics lens being positioned about the solar frame opposite the base panel unit;
the base panel unit and the solar structure delineating an interior volume;
the base panel unit further comprises a magnetic base, a rotational base, a plurality of magnets, and a ball bearing;
the solar structure being adjacently connected to the rotational base;
the plurality of magnets being perimetrically positioned about the rotational base;
the rotational base being positioned in between the solar structure and the magnetic base;
the ball bearing being positioned through the rotational base; and
the ball bearing being concentrically positioned with the rotational base.

13. A three dimensional photovoltaic module comprising:
a base panel unit;
a solar structure;
the solar structure comprises a solar frame, a plurality of solar cells, and a concentrated photovoltaic lens;
each of the plurality of solar cells comprises a first photovoltaic cell;
the solar structure being adjacently connected to the base panel unit;
each of the plurality of solar cells being perimetrically connected to the solar frame;
the concentrated photovoltaics lens being perimetrically connected to the solar frame;
the concentrated photovoltaics lens being positioned about the solar frame opposite the base panel unit;
the base panel unit and the solar structure delineating an interior volume;
a plurality of acoustic levitation modules; and
the plurality of acoustic levitation modules being perimetrically positioned around the base panel unit.

14. The three dimensional photovoltaic module as claimed in claim 13 comprises:
each of the plurality of acoustic levitation modules comprises a speaker and a frequency generator;
the frequency generator being electrically connected to the speaker; and
the speaker being oriented towards the base panel unit.

15. The three dimensional photovoltaic module as claimed in claim 1 wherein each of the plurality of solar cells is triangular.

16. The three dimensional photovoltaic module as claimed in claim 1, wherein the solar cells are two-sided.

* * * * *